US006600356B1

(12) United States Patent
Weiss

(10) Patent No.: US 6,600,356 B1
(45) Date of Patent: Jul. 29, 2003

(54) ESD PROTECTION CIRCUIT WITH CONTROLLED BREAKDOWN VOLTAGE

(75) Inventor: Frederick G. Weiss, Newberg, OR (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/302,562

(22) Filed: Apr. 30, 1999

(51) Int. Cl.$^7$ ................................................ H03K 5/08
(52) U.S. Cl. ...................................... 327/310; 327/313
(58) Field of Search ................................ 327/309, 310, 327/313, 314, 317, 320, 321, 324, 325, 326, 379; 361/91.1, 91.2

(56) References Cited

U.S. PATENT DOCUMENTS

| | | | | |
|---|---|---|---|---|
| 4,875,130 A | * | 10/1989 | Huard | 361/56 |
| 5,117,123 A | * | 5/1992 | Sendelweck | 327/419 |
| 5,132,564 A | * | 7/1992 | Fletcher et al. | 326/30 |
| 5,196,981 A | * | 3/1993 | Kuo | 361/56 |
| 5,276,582 A | * | 1/1994 | Merrill et al. | 361/111 |
| 5,594,326 A | * | 1/1997 | Gilbert | 323/313 |
| 5,615,073 A | * | 3/1997 | Fried et al. | 361/56 |
| 5,719,427 A | * | 2/1998 | Tong et al. | 257/316 |
| 5,719,737 A | * | 2/1998 | Maloney | 361/111 |
| 5,747,834 A | * | 5/1998 | Chen et al. | 257/111 |
| 5,774,318 A | * | 6/1998 | McClure et al. | 361/56 |
| 5,789,785 A | * | 8/1998 | Ravanelli et al. | 257/361 |
| 5,815,356 A | * | 9/1998 | Rodriguez et al. | 361/91 |
| 5,850,094 A | * | 12/1998 | Kato et al. | 257/355 |
| 5,917,336 A | * | 6/1999 | Smith et al. | 326/30 |
| 6,064,249 A | * | 5/2000 | Duvvury et al. | 327/314 |
| 6,078,204 A | * | 6/2000 | Cooper et al. | 327/309 |
| 6,169,439 B1 | * | 1/2001 | Teggatz et al. | 327/309 |

OTHER PUBLICATIONS

*Translinear Circuits: An Historical Overview* by Barrie Gilbert, Analog Integrated Circuits and Signal Processing, pp. 95–118 (1996).

(List continued on next page.)

*Primary Examiner*—Matthew Smith
*Assistant Examiner*—Paul Dinh
(74) *Attorney, Agent, or Firm*—Marger Johnson & McCollom, PC

(57) ABSTRACT

An ESD protection circuit utilizes a trigger network to allow the user to select the breakdown voltage of an avalanche transistor. By implementing the trigger network as a string of diodes coupled between the collector and base of the avalanche transistor, the trigger voltage can be programmed between $BV_{CEO}$ and $BV_{CBO}$ by adjusting the number of diodes. When the voltage across the trigger network reaches a predetermined value at which the diodes are conducting under forward biased conditions, but the transistor is below $BV_{CBO}$, base charge supplied to the transistor caused the transistor to avalanche. A base-emitter resistor prevents false triggering by removing leakage charge from the base of the transistor, and another resistor coupled in series with the base of the transistor limits the removal of charge, thereby causing the avalanche to be self-sustaining once initiated by the trigger network. One or more forward-biased diodes can be coupled in series with the transistor to increase the voltage across the protection circuit during avalanche. In an alternative embodiment, one or more diodes are connected in series with an open-base avalanche transistor for increasing the voltage across the protection circuit when the transistor avalanches, thereby increasing the margin between the avalanche voltage and the normal operating voltage.

8 Claims, 2 Drawing Sheets

OTHER PUBLICATIONS

Amerasekera and Duvvury; *ESD In Silicon Integrated Circuits;* John Wiley; pp. 44–47 (1995).

Amerasekera and Chatterjee; "An Investigation of BiCMOS ESD Protection Circuit Elements and Applications in Submicron Technologies"; EOS/ESD Symposium; pps. 265–276 (1992).

Chatterjee, et al; "Design and Simulation of a 4kV ESD Protection Circuit for a 0.8μm BiCMOS Process"; *Tech. Dig.* EIDM 1991, p. 913–916.

Duvvury, et al.; Lateral DMOS Design for ESD Robustness; *Tech. Dig.* IEDM 1997; p. 375–378.

Gray, Paul R. and Meyer, Robert G., *Analysis and Design of Analog Integrated Circuits;* New York; John Wiley & Sons, Inc., 1977; pp. 8–10 and 19–28.

Tektronix® Instruction Manual; "Type 4S2A Dual–Trace Sampling Unit"; Section 3; Circuit Description; Beaverton, Oregon; Tektronix, Inc.; 1966.

Tektronix® Instruction Manual; "S–6 Sampling Head"; Section 3; Circuit Description; Beaverton, Oregon; Tektronix, Inc.; 1971.

* cited by examiner

ESD PROTECTION CIRCUIT WITH CONTROLLED BREAKDOWN VOLTAGE

BACKGROUND OF THE INVENTION

1. Field of the Invention

This invention relates generally to ESD protection circuits, and more particularly, to ESD protection circuits having a controlled breakdown voltage.

2. Description of the Related Art

Integrated circuits utilize protection circuits to prevent damage from excessive voltage caused by electrostatic discharge (ESD) or power supply overvoltage events. Prior art protection circuits typically utilize reverse-biased diodes acting as avalanche breakdown "clamps" as shown in FIG. 1 to limit the voltage between the power supply terminals of an integrated circuit (IC). However, a problem with using a reverse-biased diode as a clamp is that the breakdown voltage of the diode can vary widely depending on the IC fabrication process and the design approach used to build the junction. Under some process conditions, the diode voltage under ESD conditions can approach 50–70 volts, which is much too high to protect the IC.

Another approach to providing ESD protection involves the use of an avalanche transistor with a floating base terminal as shown in FIG. 2. This circuit relies on the $BV_{CEO}$ of the avalanche transistor which, for a large NPN transistor fabricated using a contemporary RF processes, is typically about 7 volts. When used in this configuration, any leakage current across the base-collector junction, as well as any current driven into the base from the base-emitter junction, is multiplied by impact-ionization in the high-field region in the reverse-biased base-collector junction's depletion region. The fact that none of the current in the base is siphoned off through the base terminal, but instead is subject to β-multiplication in the base-emitter junction, serves to reduce the $BV_{CBO}$, which is typically about 15–17 volts, down to a $BV_{CEO}$ of about 7 volts.

Although the avalanche transistor of FIG. 2 typically provides a lower avalanche breakdown voltage than a reverse-biased diode, the $BV_{CEO}$ is a strong function of process-related parameters such as $I_S$, $\beta_F$, temperature, hot electron effects, doping profiles, etc., which make it highly variable. Thus, the transistor in a modem IC process can break down during normal operation if a power supply transient occurs, especially if the circuit is used with a 5.5 volt supply.

SUMMARY OF THE INVENTION

In one embodiment of the present invention, an ESD protection circuit utilizes a base-emitter resistor to remove charge from an avalanche transistor, thereby providing a measure of control over the breakdown voltage which can be adjusted by varying the value of the base-emitter resistor.

In another embodiment of the present invention, an ESD protection circuit utilizes one or more diodes connected in series with an avalanche transistor for increasing the voltage across the protection circuit when the transistor avalanches, thereby increasing the margin between the avalanche voltage and the normal operating voltage.

In a further embodiment of the present invention, an ESD protection circuit utilizes a trigger network coupled to an avalanche transistor for driving the transistor so as to trigger avalanche when the voltage across the ESD protection circuit reaches a trigger voltage. In one embodiment, the trigger network includes a string of diodes coupled between the collector and base of the avalanche transistor. When the voltage across the trigger network reaches a predetermined value at which the diodes are forward biased to conduct a significant amount of current, the network begins supplying base current to the transistor, thereby triggering avalanche. The trigger voltage can be programmed by adjusting the number of diodes, or by adjusting the breakdown voltage of one or more reverse-biased zener diodes used in place of one or more of the normal diodes in another embodiment. A base-emitter resistor prevents false triggering by removing leakage charge from the base of the transistor. A base resistor coupled in series with the transistor limits the removal of charge under avalanche conditions, thereby causing the avalanche to be self-sustaining once initiated by the trigger network. One or more forward-biased diodes can be coupled in series with the transistor to increase the voltage across the protection circuit during avalanche.

An advantage of the present invention is that it provides improved control of the breakdown voltage of an ESD protection network.

Another advantage of the present invention is that it provides immunity from the process-dependent values of $BV_{CEO}$ and $BV_{CBO}$ of an avalanche transistor.

A further advantage of the present invention is that it provides immunity from false discharge due to leakage current.

DETAILED DESCRIPTION

Figure 1:
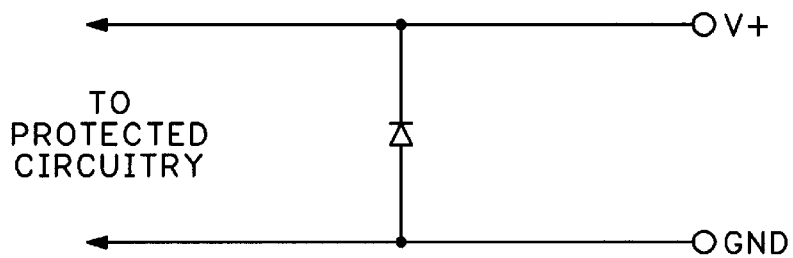
FIG. 1 is a schematic diagram of a prior art ESD protection circuit utilizing a reverse-biased diode acting as an avalanche breakdown clamp.
Figure 2:
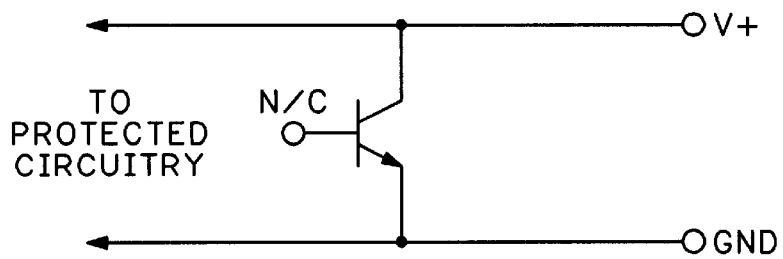
FIG. 2 is a schematic diagram of a prior art ESD protection circuit utilizing the avalanche breakdown of an open base transistor.
Figure 3:
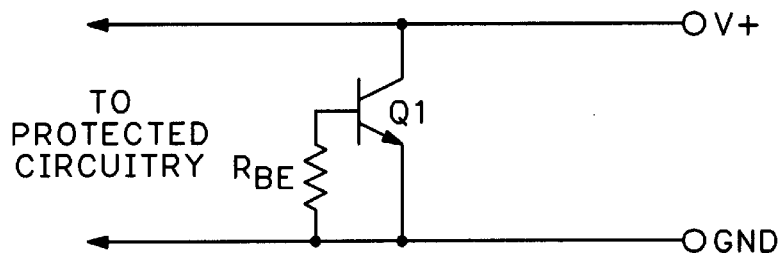
FIG. 3 is a schematic diagram of a first embodiment of an ESD protection circuit in accordance with the present invention utilizing an avalanche transistor having a base-emitter resistor.

FIG. 3 is a schematic diagram of a first embodiment of an ESD protection circuit in accordance with the present invention. The circuit of FIG. 3 includes an NPN transistor Q1 having its emitter connected to the power supply common node GND, its collector connected to the positive power supply node V+, and its base connected to its emitter through a resistor $R_{BE}$. The avalanche breakdown voltage of the transistor can be controlled by varying the value of $R_{BE}$ which removes leakage charge from the base of Q1. For very large values of $R_{BE}$ (greater than about 100 KΩ) the breakdown voltage is very nearly equal to the $BV_{CEO}$, since most of charge entering the base from the collector continues flowing to the emitter. Conversely, for relatively small values of $R_{BE}$ (less than about 1 KΩ), the avalanche breakdown voltage closely approximates the $BV_{CBO}$ characteristic.

The circuit of FIG. 3 provides control of the protection circuit by allowing the breakdown voltage to be varied between $BV_{CEO}$ and $BV_{CBO}$. However, the breakdown voltage still depends on the transistor characteristics which determine the current multiplication necessary for initiation of avalanche, and therefore, the breakdown voltage is still process dependent.

Figure 4:
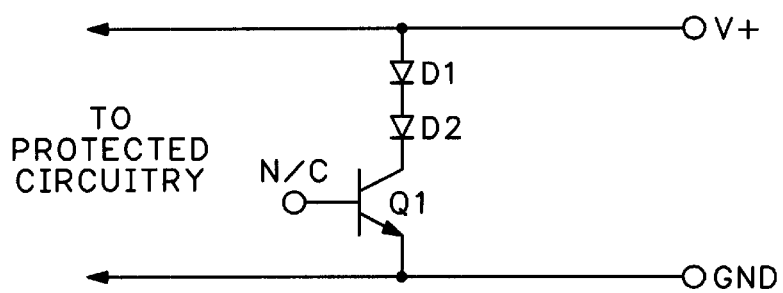
FIG. 4 is a schematic diagram of a second embodiment of an ESD protection circuit in accordance with the present invention utilizing an avalanche transistor having forward-biased diodes in series with the transistor.

FIG. 4 is a schematic diagram of a second embodiment of an ESD protection circuit in accordance with the present invention. The circuit of FIG. 4 includes an NPN transistor Q1 having its emitter connected to the power supply common node GND, its collector connected to the positive power supply node V+ through two series connected diodes D1 and D2, and its base left floating (unconnected). Alternatively, the diodes can be connected in series with the emitter rather than the collector of Q1.

The voltage drop across diodes D1 and D2, which are forward biased when current flows into the collector of Q1, increases the margin between the normal power supply operating voltage and $BV_{CEO}$, thereby reducing the susceptibility to power supply transients. The diodes also increase the voltage across the network during avalanche, ensuring that the circuit will not remain conducting when the positive power supply node V+ returns to its normal range. However, the breakdown voltage of circuit of FIG. 4 is still highly process dependent.

Figure 5:
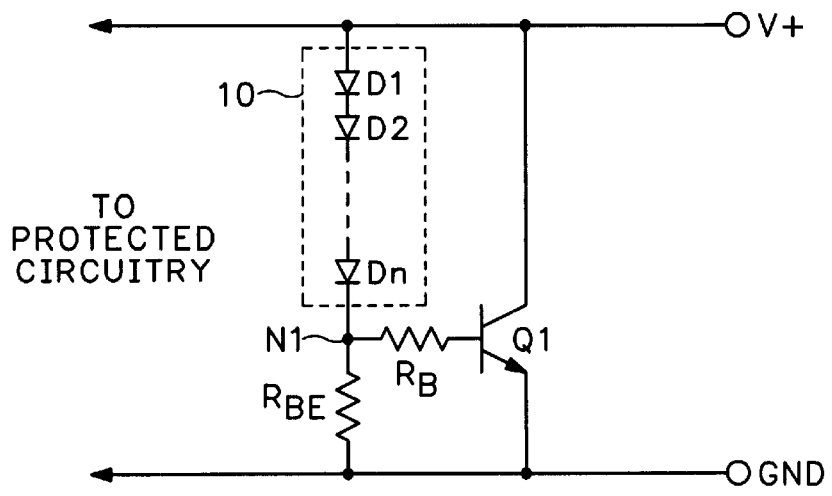
FIG. 5 is a schematic diagram of a third embodiment of an ESD protection circuit in accordance with the present invention utilizing an avalanche transistor having a trigger network.

FIG. 5 is a schematic diagram of a third embodiment of an ESD protection circuit in accordance with the present invention. The circuit of FIG. 5 includes an NPN transistor Q1 having its emitter connected to the power supply common node GND, its collector connected to the positive power supply node V+, and its base connected to a node N1 through a resistor $R_B$. A resistor $R_{BE}$ is connected between node N1 and GND, and a trigger network 10 is connected between V+ and node N1. In the circuit of FIG. 5, the trigger network 10 includes "n" diodes D1, D2, . . . Dn connected in series with their anodes oriented towards V+ and their cathodes oriented towards node N1.

The operation of the circuit of FIG. 5 is based on the following principles. If the base of a bipolar junction transistor (BJT) is connected to its emitter through a base-emitter resistor $R_{BE}$ having a relatively low value (about 50 Ω–1 KΩ), and its collector is biased near $BV_{CBO}$, a positive voltage pulse applied to the base causes a very rapid increase in collector current. If the pulse is short, the transistor avalanches but then turns off because charge is removed from the base by the base-emitter resistor.

The avalanche can be made self-sustaining by inserting a base resistor $R_B$ having a relatively high value (about 10 KΩ–100 KΩ) in series with the base of the BJT. In this case, once avalanche breakdown is initiated by an external pulse applied to the base, the collector-emitter voltage $V_{CE}$ falls to $BV_{CEO}$ and remains stable because the relatively high resistance of $R_B$ limits the removal of charge from the base and allows enough charge to remain in the base to sustain the breakdown mechanism.

Referring to FIG. 5, trigger network 10 drives the base of Q1 by providing the trigger pulse required to initiate avalanche breakdown when the voltage across the trigger network reaches a predetermined level. The number of diodes "n" is chosen such that $$BV_{CEO} < n \cdot V_D(\text{on}) < BV_{CBO}$$

where $V_D(\text{on})$ is the forward voltage drop across each diode, and $n \cdot V_D(\text{on})$ is the predetermined voltage level at which current begins flowing through the trigger network.

In operation, as the voltage at the positive power supply node V+ rises and approaches a trigger voltage given by:

$$V_{TRIGGER} \approx n \cdot V_D(\text{on}) + 0.5V,$$

a relatively large amount of current (on the order of nanoamps, which is much greater than the transistor saturation current $I_S (\sim 10^{-18}$ amps)) is injected into the base of Q1 through trigger network 10. Once even this modest conduction occurs, $\beta_F$ increases from its low-injection level, more current is driven into the collector-base junction where it is multiplied and fed back into the base, and the transistor avalanches. The collector current pulls the voltage $V_p$ at the positive power supply node down to a level below $BV_{CEO}$, thereby turning off the diodes in the trigger network. Since $R_B$ is relatively large, the breakdown is self-sustaining even after the diodes turn off. Transistor Q1 turns off when $V_{CE}$ drops below the self-sustaining voltage, as for example, when the charge on the external ESD source (typically capacitive) is dissipated.

An advantage of the circuit of FIG. 5 is that the trigger voltage can easily be programmed into the circuit by adjusting the number of diodes in the trigger network. A string of about 12 diodes (n=12) has been found to provide an acceptable trigger voltage when the circuit is fabricated using a process that provides RF transistors having a typical $BV_{CBO}$ of about 15–18 volts (which by itself is too high to provide adequate protection) and $BV_{CEO}$ of about 5.5 volts (which is too low to prevent unwanted triggering when a 5.5 volt supply is used).

Alternatively, the trigger network 10 can be implemented using one or more zener diodes which are reverse-biased when V+ increases, or a combination of reverse-biased zener diodes and forward-biased diodes can be used.

A further advantage of the circuit of FIG. 5 is that it provides immunity from false discharge due to leakage currents. Using an $R_{BE}$ of at least about 1 KΩ ensures that leakage does not turn the transistor on. Preferred values of $R_{BE}$ and $R_B$ are 3 KΩ and 20 KΩ, respectively.

Yet another advantage of the circuit of FIG. 5 is that it provides immunity from the variability in the uncontrolled values of $BV_{CBO}$ and $BV_{CEO}$. Although the string of diodes used in the trigger network is still subject to variability in the trigger voltage due to process and thermal effects, the parameters which contribute to this variability are better understood and subject to less uncertainty than those which influence avalanche breakdown, and therefore are easier to control.

Figure 6:
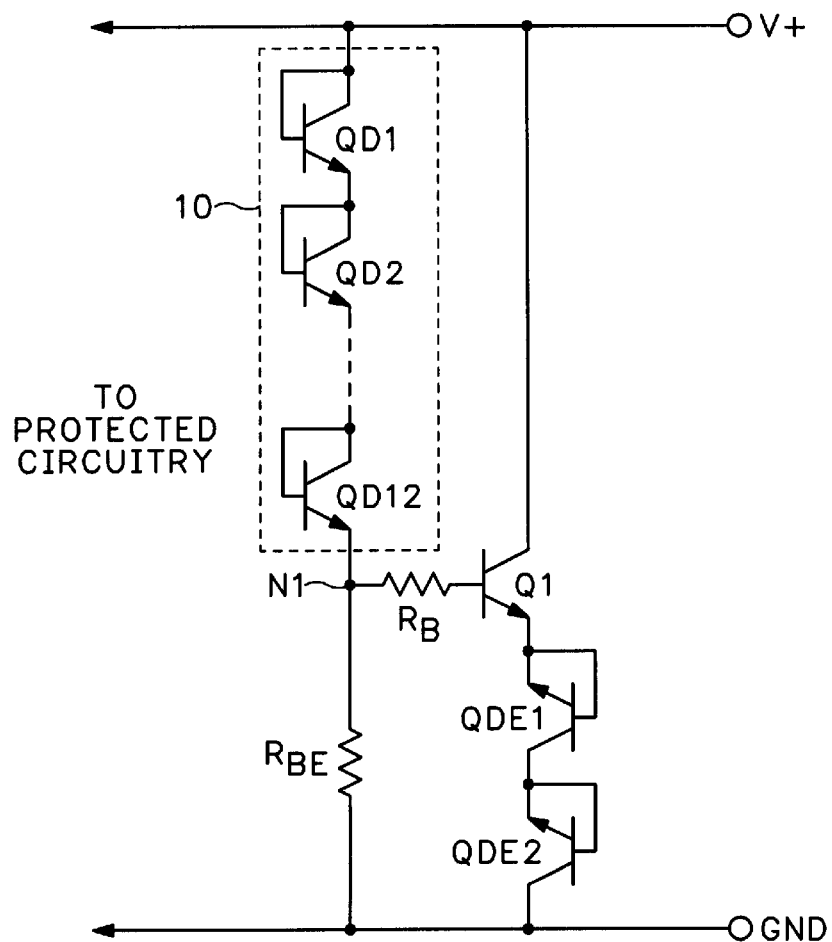
FIG. 6 is a schematic diagram of a fourth embodiment of an ESD protection circuit in accordance with the present invention having a trigger network and forward-biased diodes in series with the transistor.

FIG. 6 is a schematic diagram of a fourth embodiment of an ESD protection circuit in accordance with the present invention. The circuit of FIG. 6 is similar to that of FIG. 5, but includes two diode-connected transistors QDE1 and QDE2 connected in series with the emitter of Q1 to increase the voltage between the power supply nodes V+ and GND during avalanche by providing two additional diode drops. Alternatively, the QDE1 and QDE2 can be connected in series with the collector rather than the emitter of Q1. This additional voltage drop might be necessary in situations where there is not enough margin between $BV_{CEO}$ of the transistor and the intended power supply operating voltage. Also, in practice, the collector-emitter voltage $V_{CE}$ drops below $BV_{CEO}$ after the transistor is triggered, and the additional voltage drop provided by QDE1 and QDE2 ensures that the normal power supply voltage will not sustain the breakdown once it has been triggered by, for example, a power supply transient.

Diode-connected transistors QDE1 and QDE2 must be physically large devices to carry the full avalanche current flowing through Q1. In one practical implementation, they are implemented as 8×70 μm devices. To improve the current carrying capacity of QDE1 and QDE2, their bases are diode-connected to their emitters rather than their collectors because the base-collector junctions are larger than the base-emitter junctions. Transistor Q1 is implemented as a (0.8×27.5 μm) x 19-emitter device. The diodes in trigger network 10 of FIG. 6 are shown as diode-connected transistors QD1–QD12. Although, in theory, QD1–QD12 can be much smaller than the other devices because they carry very little current, a considerable amount of surface area might be required to make these devices robust.

Although the embodiments of the present invention disclosed herein are implemented with BJTs and are primarily applicable to bipolar or BiCMOS integrated circuits, other implementations and applications are also possible; so for example, the corresponding terminals of a different type of current control device, such as a field-effect transistor (FET), would be understood to relate to base, emitter, and collector of a BJT.

Also, although the embodiments described above are shown in the context of protecting power supplies from ESD and other overvoltage events, the methods and apparatus of the present invention can also be adapted for protection of signal terminals and other terminals. For example, the circuit of FIG. 6 could be scaled to reduce the capacitance, thereby making it suitable for protecting an open-collector signal pin.

Having described and illustrated the principles of the invention in a preferred embodiment thereof, it should be apparent that the invention can be modified in arrangement and detail without departing from such principles. We claim all modifications and variations coming within the spirit and scope of the following claims.

What is claimed is:

1. A protection circuit comprising:
    a transistor having a first terminal coupled to a first node, a second terminal coupled to a second node, and a third terminal;
    a trigger network coupled between the first node and the third terminal of the transistor for driving the transistor responsive to the voltage at the first node, thereby causing the transistor to avalanche when the voltage between the first and second nodes reaches a trigger voltage;
    a first resistor coupled between the third terminal of the transistor and the second node for removing charge from the transistor, thereby preventing false triggering; and
    a second resistor coupled between the first resistor and the third terminal of the transistor for limiting the removal of charge from the transistor, thereby causing the avalanche of the transistor to be self-sustaining.

2. A protection circuit according to claim 1 wherein the trigger network includes a plurality of diodes coupled in series.

3. A protection circuit according to claim 1 wherein the trigger network includes a zener diode.

4. A protection circuit according to claim 1 further including a diode coupled in series with the first or second terminal of the transistor.

5. A protection circuit according to claim 4 further including a second diode coupled in series with the first diode.

6. A protection circuit comprising:
    a transistor having a first terminal coupled to a first node, a second terminal coupled to a second node, and a third terminal;
    a diode coupled in series with the first or second terminal of the transistor;
    a first resistor coupled between the third terminal of the transistor and the second node; and
    a trigger network coupled between the first node and the third terminal of the transistor;
    wherein:
        the first resistor and the trigger network are coupled together at a third node; and
        the third node is coupled to the third terminal of the transistor through a second resistor.

7. A method for operating a protection circuit including a transistor having a first terminal coupled to a first node and a second terminal coupled to a second node, the method comprising:
    driving a third terminal of the transistor responsive to the voltage at the first node, thereby causing the transistor to avalanche when the voltage between the first and second nodes reaches a trigger voltage;
    removing charge from the transistor, thereby preventing false triggering; and
    limiting the removal of charge from the transistor, thereby causing the avalanche of the transistor to be self-sustaining.

8. A method according to claim 7 further including increasing the voltage between the first and second nodes during avalanche.

* * * * *